United States Patent [19]
Oka et al.

[11] Patent Number: 5,337,474
[45] Date of Patent: Aug. 16, 1994

[54] PROCESS FOR FABRICATING ELECTRONIC DEVICES AND IMAGE SENSOR

[75] Inventors: Koichi Oka; Hirokazu Ichikawa, both of Kanagawa, Japan

[73] Assignee: Fuji Xerox Co., Ltd., Tokyo, Japan

[21] Appl. No.: 889,994

[22] Filed: May 29, 1992

[30] Foreign Application Priority Data

May 31, 1991 [JP] Japan .................................. 3-156147

[51] Int. Cl.$^5$ .............................................. H05K 3/02
[52] U.S. Cl. ........................................ 29/846; 29/412; 29/832; 29/840; 437/207; 437/209
[58] Field of Search ................. 29/912, 825, 830, 832, 29/840; 437/209, 207

[56] References Cited

U.S. PATENT DOCUMENTS

| | | | |
|---|---|---|---|
| 3,864,810 | 2/1975 | Hargis | 29/412 X |
| 4,316,320 | 2/1982 | Nogawa et al. | 29/832 X |
| 4,426,773 | 1/1984 | Hargis | 29/832 |
| 4,617,729 | 10/1986 | Celnik | 29/840 |
| 4,893,168 | 1/1990 | Takahashi et al. | 437/209 X |
| 5,027,505 | 7/1991 | Nakamura et al. | 29/412 X |
| 5,133,118 | 7/1992 | Lindblad et al. | 437/207 X |

FOREIGN PATENT DOCUMENTS

| | | | |
|---|---|---|---|
| 58-9360 | 1/1983 | Japan | 437/209 |
| 2-65278 | 3/1990 | Japan | |

OTHER PUBLICATIONS

IBM Technical Disclosure Bulletin vol. 10 No. 8 Jan. 1968, p. 1092 by A. E. Huard et al.

*Primary Examiner*—Carl J. Arbes
*Attorney, Agent, or Firm*—Finnegan, Henderson, Farabow, Garrett & Dunner

[57] ABSTRACT

Input/output areas of device elements are provided at opposite ends of the original substrate, and two function areas are provided between the opposite input/output areas. The original substrate composing a large-size device is cut along lines in such a way that the input-/output areas and the function areas are separated from one another. As a result, those portions of the original substrate where no function areas are to be formed are reduced, thereby contributing to effective utilization of the surface of the substrate for increasing the number of sensor substrates that can be yielded from it. The process is improved in the shape and layout of the substrates for electronic devices to be obtained by cutting the large-area device formed on the substrate and it hence is capable of yielding a greater number of electronic device elements from the large-area device.

12 Claims, 6 Drawing Sheets

PROCESS FOR FABRICATING ELECTRONIC DEVICES AND IMAGE SENSOR

BACKGROUND OF THE INVENTION

The invention relates to a process for fabricating image sensors and other electronic devices for use in the image input section of facsimiles, digital copiers, image scanners and other image forming apparatus. Also, the invention relates to an image sensor.

Image sensors are used in facsimiles and other image forming apparatus to read image information. With a view to realizing a compact system, active efforts are being made to develop "contact image sensors" which do not use a reducing optical system but which are placed in proximity to the document surface so as to read the image on it. A contact image sensor of the type contemplated by the present invention comprises an insulating substrate carrying an array of light-receiving elements of a sandwich or other type that are formed by a thin-film stacking process and the electric charges generated in each of the light-receiving elements are sequentially extracted on a time basis by means of drive ICs provided in the neighborhood of the insulating substrate, thereby producing an image signal. A typical example of the conventional contact image sensor is shown in FIG. 10. A plurality of linear sensor arrays 11 are formed on a large-size insulating substrate 1 by a thin-film process and, thereafter, the substrate 1 is cut along lines 2 parallel to the sensor arrays 11, thereby yielding contact image sensors formed on separate rectangular sensor substrates 3. In order to reduce the number of drive ICs (not shown) that need to be used with contact image sensors of the configuration described above, it has been proposed that the sensor arrays 11 be grouped in more than one block whereas the light-receiving elements that compose each sensor array are matrix connected to the drive IC for each block by means of a multi-layer wiring 13 via a switching element array 12 composed of thin-film transistor elements that are associated with the individual light-receiving elements. According to the proposal, the electric charges generated by a light current in the light-receiving elements composing each block are transferred temporarily to the wiring capacity in each multi-layer wiring by selectively conducting the thin-film transistor elements for each block, and the transferred stored charges are read with the drive IC on a time basis, with the same sequence of operations being repeated for each block.

Since a plurality of contact image sensors are formed on the large-size insulating substrate 1 by a thin-film deposition process, the apparatus for implementing the process requires standardization of not only the outside dimensions of the substrate but also the area 4 where sensors and other patterns can be formed. In order to allow a certain width for each sensor array 11 while assuring efficient formation of more than one sensor substrate 3 from the single large-size insulating 1, an I/O port (input/output area) 20 having wirings for connection to an external drive IC is provided at one end of each sensor substrate 3.

However, each I/O port 20 has many wirings (e.g. signal lines that are equal in number to the light-receiving elements composing one block, gate control lines in thin-film transistor elements that are equal in number to the blocks, and bias voltage supply lines), so it has been necessary to form those wirings in three sides of an end of each sensor substrate 3 as shown in FIG. 10. This will inevitably yield sensor substrates 3 each having a pattern-free area 5 where nothing is formed by a thin-film process. The existence of such pattern-free areas 5 has eventually presented the problem of increasing the width of each sensor substrate 3 in a direction normal to sensor arrays 11, thereby reducing the number of sensor substrates 3 that can be taken from the large-size insulating substrate 1.

SUMMARY OF THE INVENTION

The present invention has been accomplished under these circumstances and has an object to provide a process that is improved in the shape and layout of the substrates for electronic devices to be obtained by cutting a large-area device formed on a large-size insulating substrate and which hence is capable of yielding a greater number of electronic device elements from the large-area device.

In order to attain the above object, the present invention provides a process for fabricating at least two electronic device elements from a large-area device, comprising the steps of: providing a first input/output area composing a first device element near one end of an original substrate composing the large-area device and a second input/output area composing a second device element near the other end of the original substrate; providing a first function area and a second function area on the original substrate between the first and second input/output areas, the first and second function areas composing the first and second device elements respectively, and being provided in such a way that they face each other; and cutting the large-area device along a line which starts on one side of the device between the first input/output area and the second function area and which ends on the other side of the device between the second input/output area and the first function area.

DETAILED DESCRIPTION OF THE INVENTION

Figure 10:
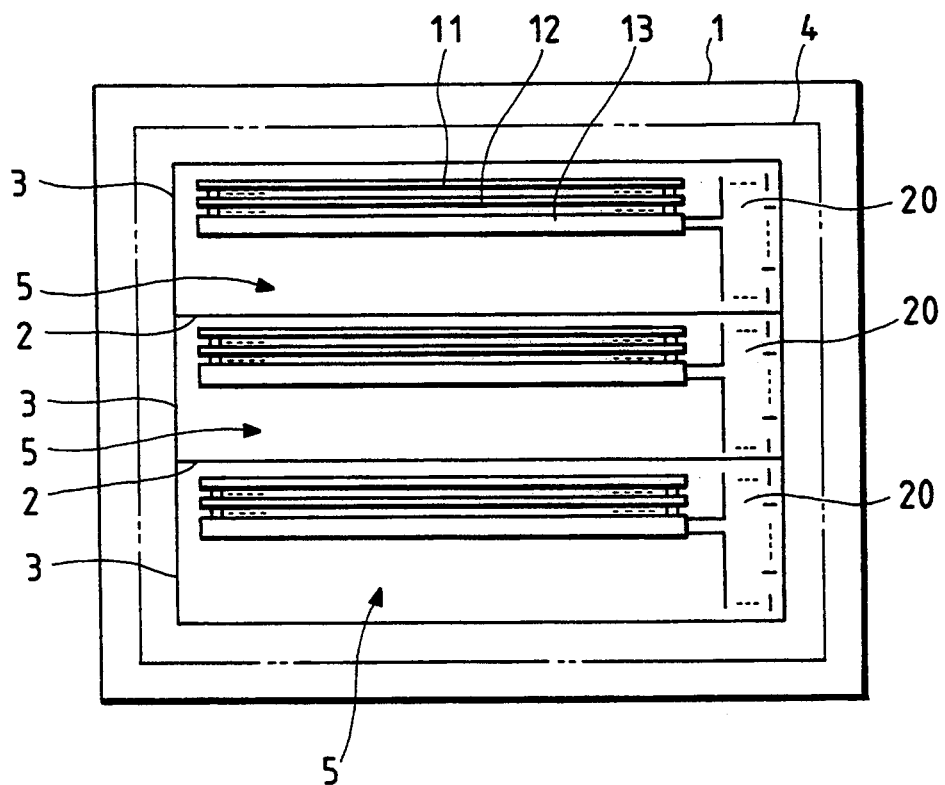
FIG. 10 is a plan view of a large-size insulating substrate intended to illustrate a conventional process for fabricating image sensors.

An embodiment of the process of the present invention for fabricating electronic devices will be described below with reference to FIG. 1, in which those parts or components which are the same as what are shown in FIG. 10 are identified by like reference numerals.

The neighborhood of an end of a large-size insulating substrate 1 is reserved as the input/output area of a first device element to be formed on the substrate and three zones of a first I/O port, 21a, 21b and 21c, are provided in that area. Each zone consists of a number of signal lines. The neighborhood of the other end of the large-size insulating substrate 1 is reserved as the input/output area of a second device element and three zones of a second I/O port, 21'a, 21'b and 21'c, are provided in that area in such a way that they face 21a, 21b and 21c, respectively. On the large-size insulating substrate 1 between the first I/O port 21 and the second I/O port 21c, three zones of a first function area, 10a, 10b and 10c, which compose the first device element and three zones of a second function area, 10'a, 10'b and 10'c, which compose the second device element are provided in such a way that they face each other to compose a large-area device.

Each function area 10 consists of a sensor array 11 of a number of light-receiving elements, a switching element array 12 of thin-film transistor elements connected to the respective light-receiving elements, and a multi-layer wiring 13 for connecting the respective thin-film transistor elements to the I/O port 21 or 21'. These components are formed by a thin-film process. The sensor array 11 has a sandwich structure in which a hydrogenated amorphous silicon (a-Si:H) film is held between a strip of lower electrode serving as a common electrode and an upper electrode that is formed of a transparent film of a conductor such as indiumtin oxide (ITO) and which is separated into pixel-associated segments.

The large-size insulating substrate 1 is then cut along both straight lines 31 that divide it into three rectangular substrates in a direction parallel to one side of the larger substrate 1 and along kinked lines 32 that separate the first function area 10 from the second function area 10', whereby six contact image sensors are taken from the single large-size insulating substrate 1. Each of the kinked cutting lines 32 consists of three lines 33, 34 and 35; the line 33 starts on one side between the first I/O port 21 and the second function area 10' of each of the rectangular substrates into which the larger substrate 1 has been divided by the straight cutting line 31 and it extends along the shorter side to the central position of each rectangular substrate; the line 34 crosses the line 33 at right angles and extends along the longer side of each rectangular substrate between the first function area 10 and the second function area 10'; and the line 35 lies between the second I/O port 21' and the first function area 10, crosses with the line 34 at right angles and ends on the other side of each rectangular substrate which is remote from the line 33.

Thus, as seen in the transverse direction of the drawing, each of the -sensor substrates 3 that carry contact image sensors is longer than in the conventional case of FIG. 10 by a margin equivalent to the I/O port 21 or 21'. However, with the standardized large-size insulating substrate 1, a reasonable dimensional allowance is inherently provided for the area 4 where patterns can be formed by a thin-film process, so there will be a practical problem if the sensor substrates 3 are of such a length that they can not be confined within that area.

Figure 2:
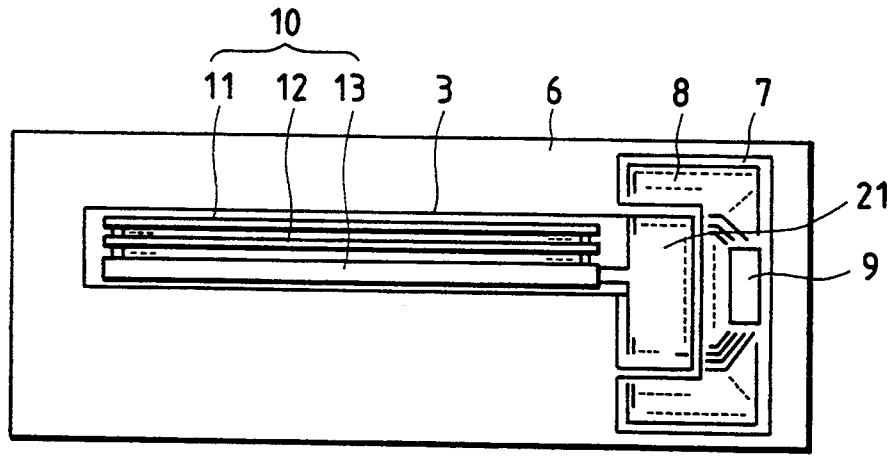
FIG. 2 in a plan view illustrating an image reading device.
Figure 3:
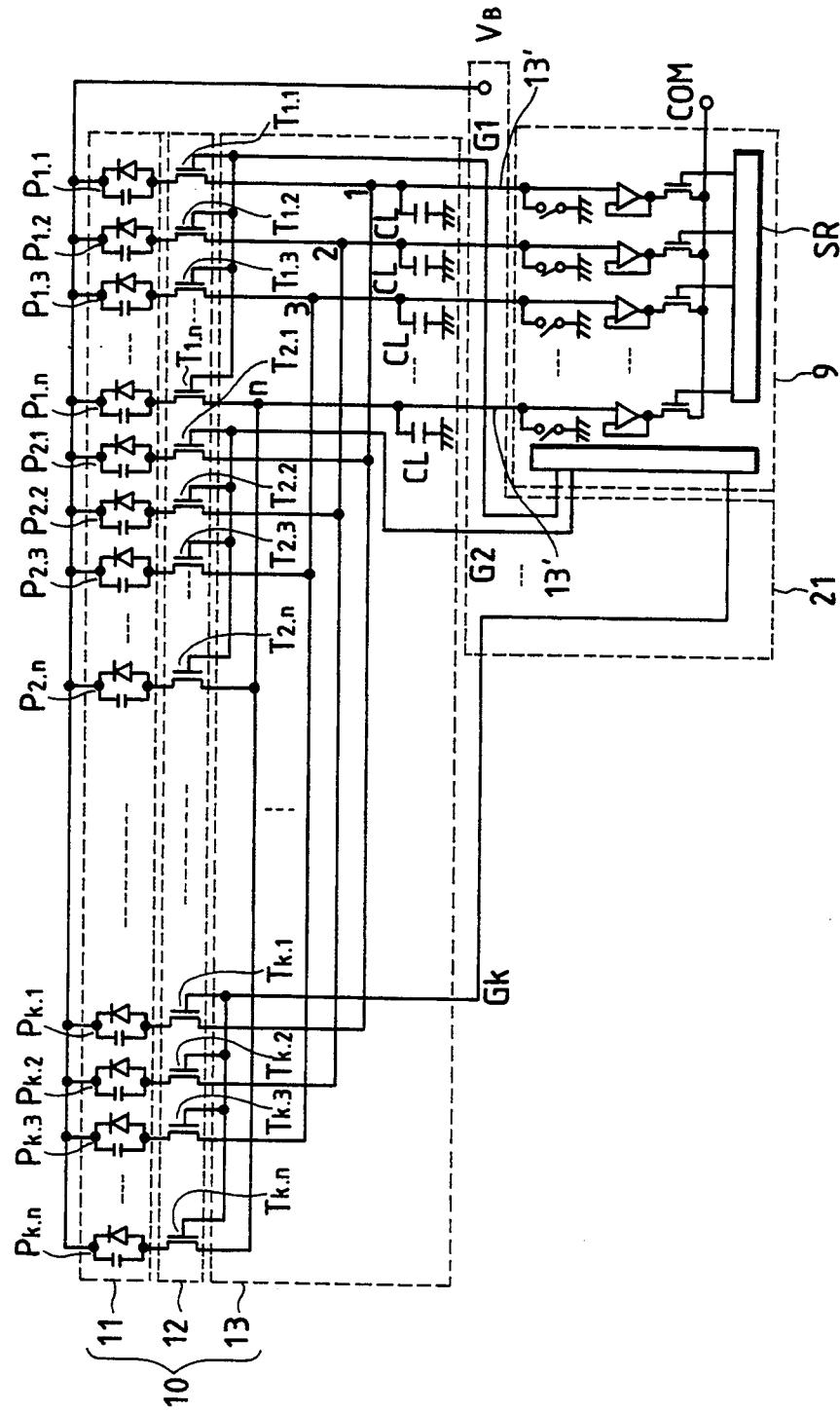
FIG. 3 is an equivalent circuit diagram for a matrix driven image sensor.

One of the sensor substrates 3 thus obtained is shown in FIG. 2; it is provided on a support 6 and its I/O port 21 is connected by bonding wires (not shown) or some other means to a printed wire pattern 8 typically formed on a glass-epoxy substrate 7, whereby an image reading device is completed. The printed wire pattern 8 is connected to various components such as a drive IC 9 for either conducting thin-film transistor elements in blocks or extracting signal charges on a time basis and a power source for applying a bias voltage to the common electrode for the sensor array in each function area 10. An equivalent circuit for the image sensor as connected to the drive IC 9 is as shown in FIG. 3. More specifically, each of the light-receiving elements that compose the sensor array 11 is represented by an equivalent circuit composed of a photodiode connected parallel to a capacitor, and the thin-film transistor elements connected to the respective light-receiving elements are inter-connected in a matrix form via the multi-layer wiring 13 in such a way that they are parallel to the drive IC for each block. The gate electrodes of the thin-film transistor elements are connected to gate signal lines that are common for each block and those gate signal lines are connected to a gate signal generator in the drive IC. Thus, the areas enclosed with dashed lines in FIG. 3 correspond to the I/O port 21.

Image reading with the image sensor of interest will be briefly described below on the basis of the equivalent circuit shown in FIG. 3. When the document is placed on the sensor array 11 in the contact image sensor, electric charges are generated in the respective light-receiving elements under exposure to the reflected light from the surface of the document. In response to selective turning on of thin-film transistor elements from one block to another, the charges generated in the light-receiving elements composing the active block are transferred to the wiring capacity CL formed in the multi-layer wiring 13. By the switching operation within the drive IC 9, the potential developed by the transferred charges in common signal lines 13' in the multi-layer wiring 13 is detected on a time basis so as to read image information for one block. These steps are repeated sequentially for all blocks, thereby producing image signals that correspond to a single line on the surface of the document.

According to the embodiment discussed above, the I/O port 21 is provided on both ends of the large-size insulating substrate 1, which is then cut along the kinked lines 32. In this way, the area of the substrate 1 where patterns are to be formed by a thin-film process is utilized effectively so that two sensor substrates 3 can be obtained from the width that is equivalent to a single sensor substrate in the conventional case, whereby the number of sensor substrates 3 that can be yielded from the large-size insulating substrate 1 is doubled so as to reduce the fabrication cost of individual contact image sensors.

The foregoing description of the embodiment assumes image sensors that are to be matrix driven by means of thin-film transistor elements. However, this is not the sole case of the present invention and it may be applicable to image sensors, printer heads and any other image reading apparatus of the type in which the function areas and I/O ports are formed by a thin-film process, with the I/O ports being formable at opposite ends of each sensor substrate.

Figure 1:
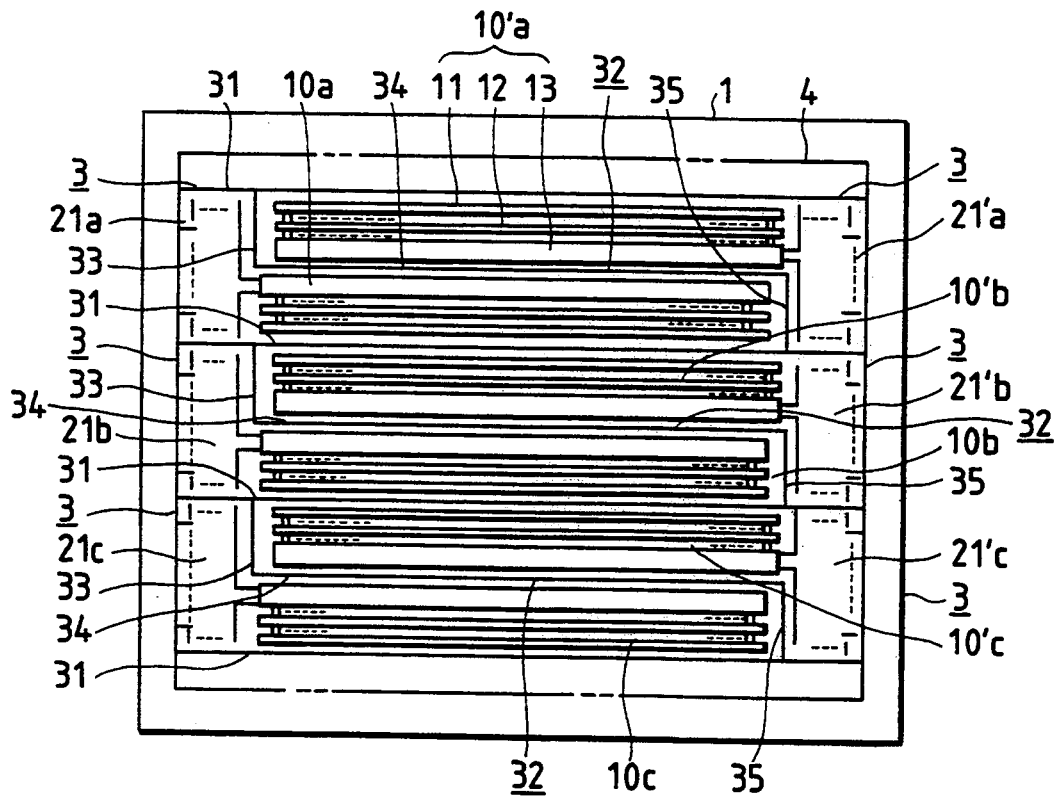
FIG. 1 is a plan view of a large-size insulating substrate intended to illustrate an embodiment of the process of the present invention.

FIGS. 4 to 9 show other embodiments of the present invention, which are modifications of the case shown in FIG. 1.

Figure 4:
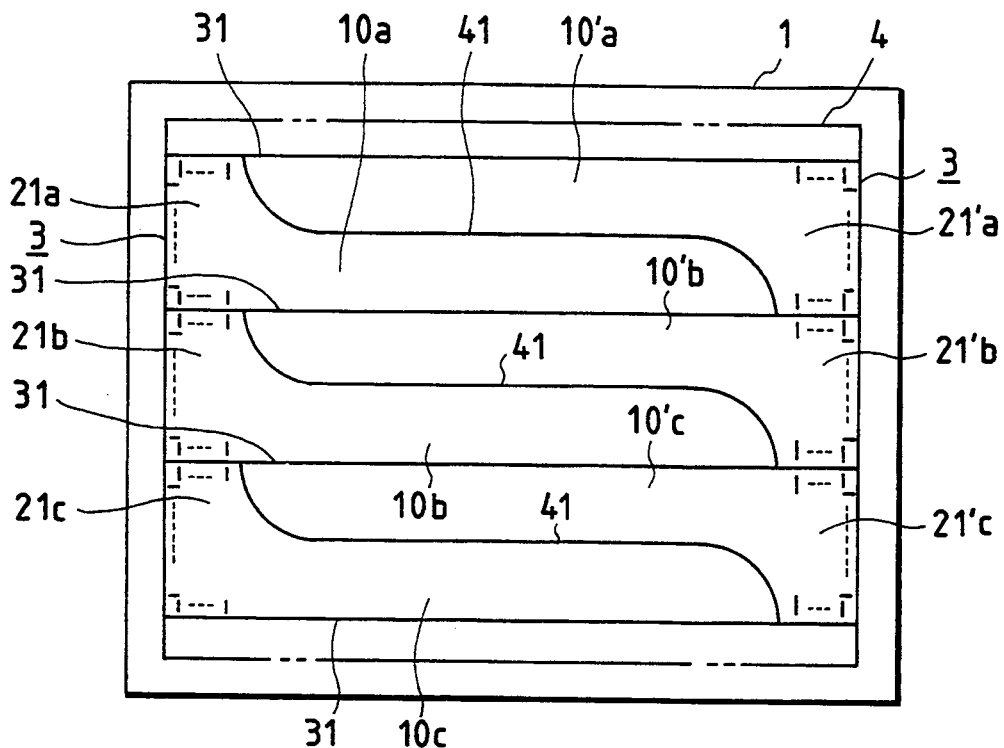
FIG. 4 is a plan view of a large-size insulating substrate intended to illustrate another embodiment of the process of the present invention.

In the embodiment shown in FIG. 4, the right-angled portions of the kinked line 32 shown in FIG. 1 are curved to produce a generally S-shaped line 41, which divides the large-size insulating substrate 1 into two sensor substrates 3, one having the first function area 10 and the first I/O port 21 and the other having the second function area 10' and the second I/O port 21'. The other parts or components are the same as in the case shown in FIG. 1 and are identified by like numerals without further explanation.

Figure 5:
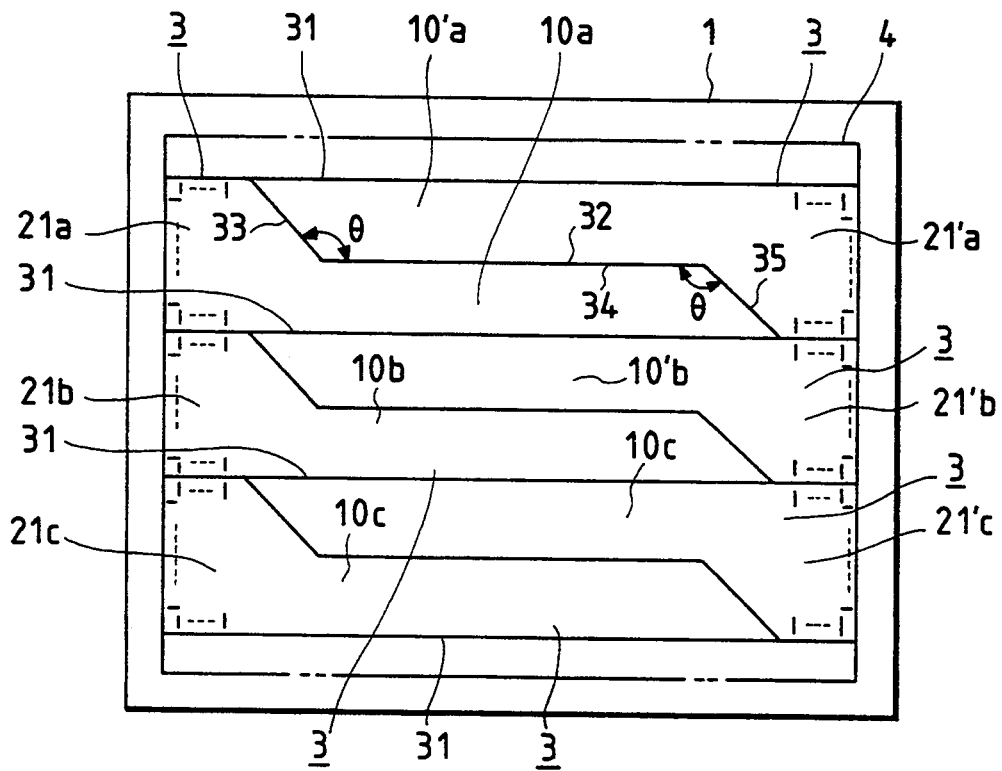
FIG. 5 is a plan view of a large-size insulating substrate intended to illustrate yet another embodiment of the process of the present invention.

In the embodiment shown in FIG. 5, the angle $\theta$ at which each of the lines 33 and 35 that are part of the kinked line 32 shown in FIG. 1 crosses with the straight line portion 34 is set to be greater than 90°. The other parts or components are the same as in the case shown in FIG. 1 and are identified by like numerals without further explanation.

Figure 6:
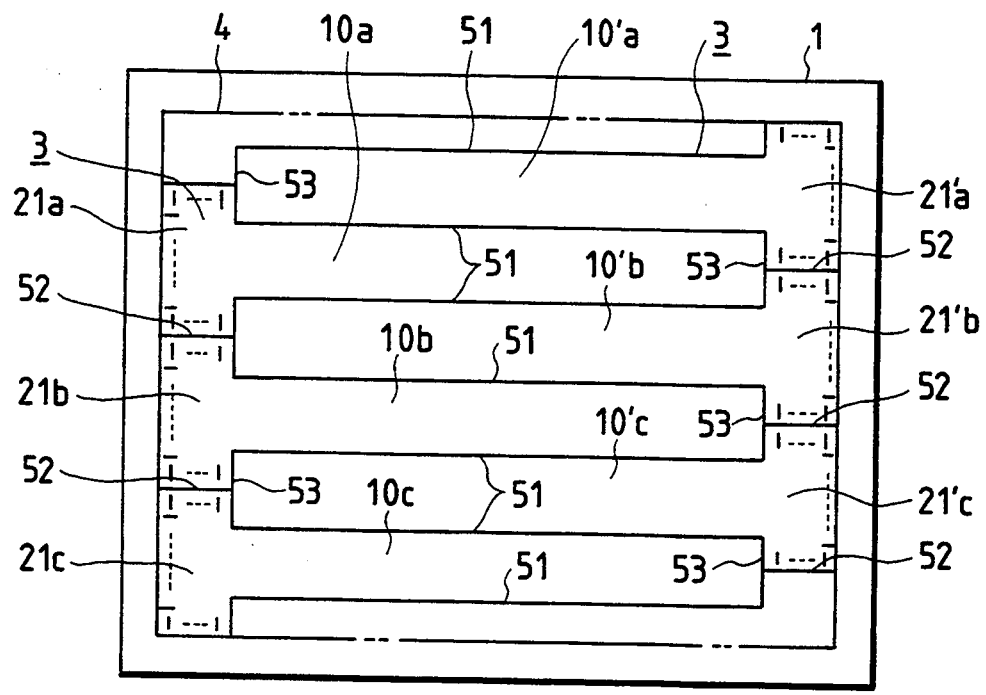
FIG. 6 is a plan view of a large-size insulating substrate intended to illustrate a further embodiment of the process of the present invention.

In the embodiment shown in FIG. 6, T-shaped sensor substrates 3 are obtained from the large-size insulating substrate 1 by cutting it along lines 51, 52 and 53; the lines 51 extend in the longitudinal direction of the function area 10; the shorter lines 52 extend parallel to the lines 51 for separating two adjacent zones of the I/O port 21 (or 21'); and the lines 53 cross the lines 51 and 52 at right angles and line near the I/O port 21 (or 21'). The other parts or components are the same as in the case shown in FIG. 1 and are identified by like numerals without further explanation.

Figure 7:
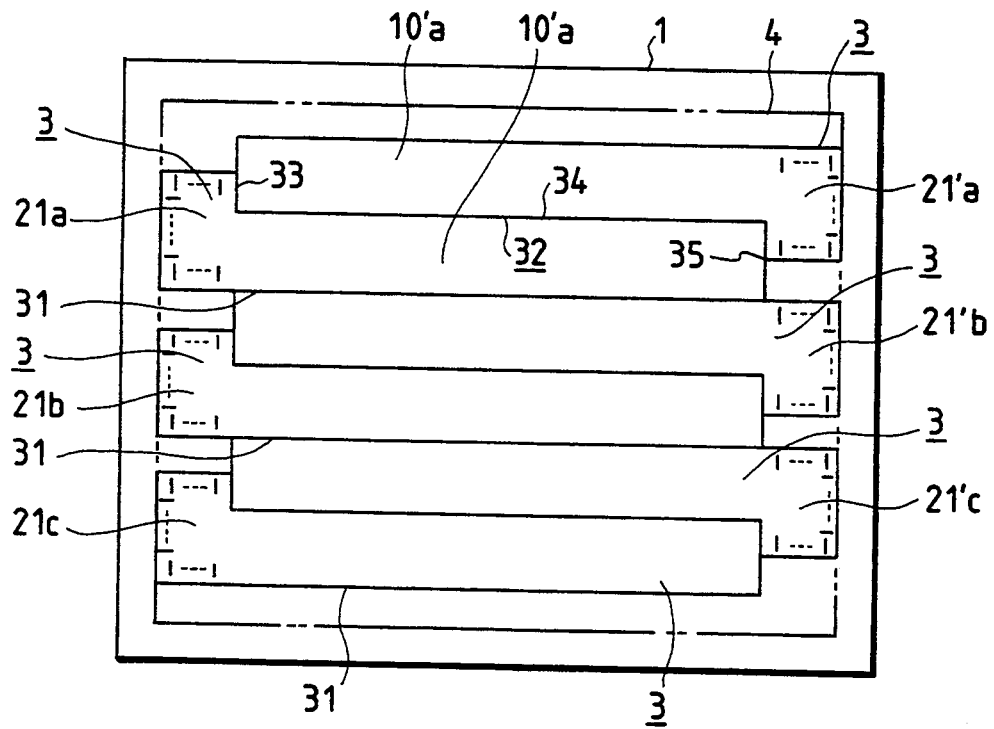
FIG. 7 is a plan view of a large-size insulating substrate intended to illustrate a still further embodiment of the process of the present invention.

The embodiment shown in FIG. 7 refers to the case of application where the I/O port 21 (or 21') is less wired and hence has a smaller area than the counterpart formed in each of the sensor substrates 3 shown in FIG. 1. The number of sensor substrates 3 that can be taken from the large-size insulating substrate 1 in this embodiment is by no means twice the number of rectangular sensor substrates that have a width comparable to that of the I/O port and that can be obtained by the conventional method; however, the embodiment retains the advantage of efficient utilization of the surface of the large-size insulating substrate 1. The other parts or components are the same as in the case shown in FIG. 1 and are identified by like numerals without further explanation.

Figure 8:
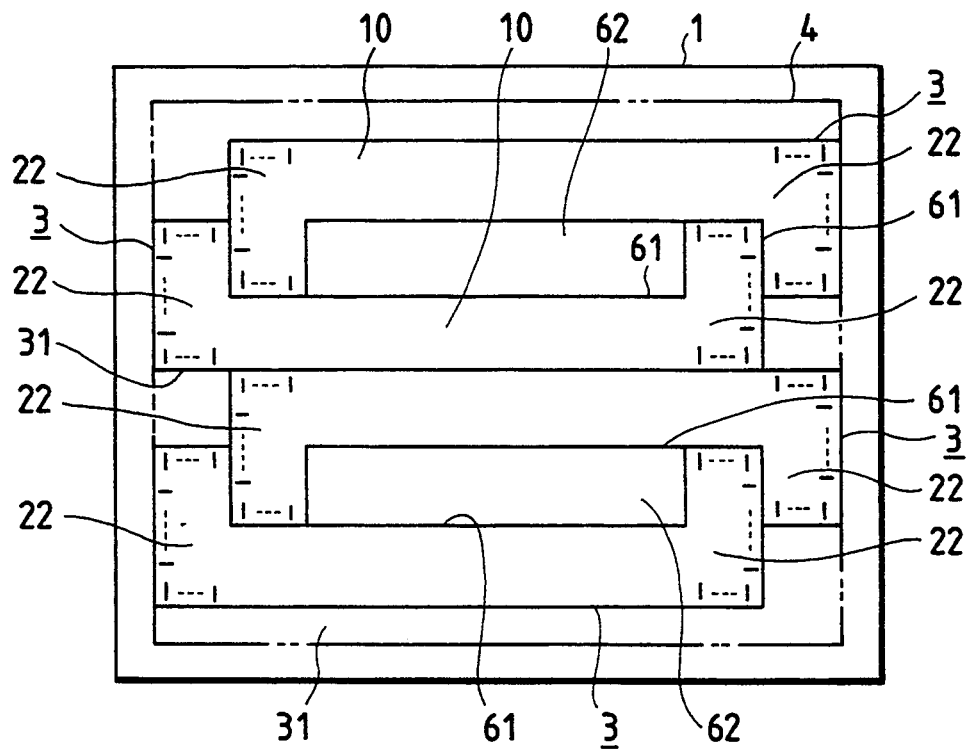
FIG. 8 is a plan view of a large-size insulating substrate intended to illustrate another embodiment of the process of the present invention.

FIG. 8 shows another embodiment in which the I/O port 21 is divided into two parts that are located as I/O ports 22 on opposite sides of each of the sensor substrates 3 which are prepared by segmenting the large-size insulating substrate 1. As shown, two I/O ports 22 that project in the same direction are formed on opposite sides of each sensor substrate 3. Since the width of each I/O port 22 is one half the width of the I/O port 21, the sensor substrate 3 is characterized in that the drive IC described hereinabove is situated on both sides of the function area 10. The large-size insulating substrate 1 is cut along lines 61 which, as shown, are formed in such a way that the projecting portions of two adjacent sensor substrates 3 face each other as they are offset by the width of each projection. The other parts or components are the same as in the case shown in FIG. 1 and are identified by like numerals without further explanation.

In the embodiment under consideration, an unnecessary region 62 is formed in the central area between two adjacent sensor substrates 3 and the number of sensor substrates that can be taken from the large-size insulating substrate 1 is by no means twice the number of rectangular sensor substrates (three) that have the I/O port 21 formed on one side and that can be obtained by the conventional method; however, the embodiment still enables four sensor substrates 3 to be obtained and retains the advantage of efficient utilization of the surface of the large-size insulating substrate 1. The advantage of efficient surface utilization is also obvious compared to the case where the substrate 1 is divided into a plurality of rectangular sensor substrates that merely have the I/O port 22 positioned on opposite sides.

Figure 9:
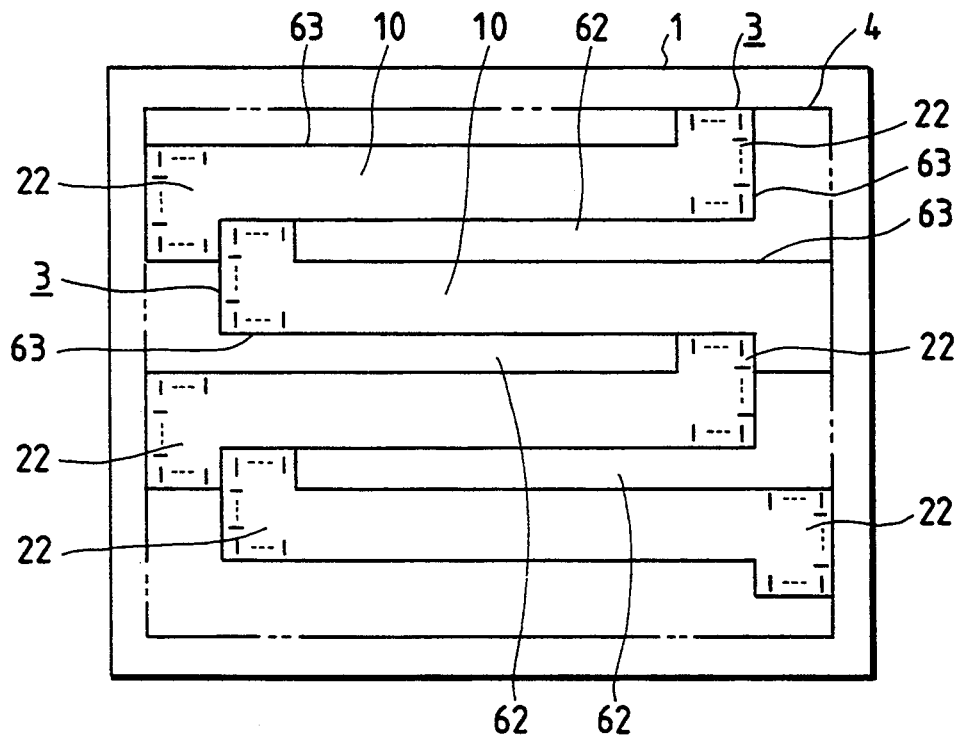
FIG. 9 is a plan view of a large-size insulating substrate intended to illustrate yet another embodiment of the process of the present invention.

FIG. 9 is the same as FIG. 8 in that it shows an embodiment in which I/O ports 22 are located on opposite sides of each of the sensor substrates 3 which are prepared by segmenting the large-size insulating substrate 1; the only difference is that two I/O ports 22 that project in opposite directions are formed on two sides of each sensor substrate 3. As in the embodiment shown in FIG. 8, the large-size insulating substrate 1 is cut along lines 63 which are formed in such a way that the projecting portions of two adjacent sensor substrates 3 face each other as they are offset by the width of each projection. The other parts or components are the same as in the case shown in FIG. 8 and are identified by like numerals without further explanation.

In the embodiment under consideration, an unnecessary region 62 is also formed in the central area between two adjacent sensor substrates 3 and the number of sensor substrates that can be taken from the large-insulating substrate 1 is by no means twice the number of rectangular sensor substrates (three) that have the I/O port 21 formed on one side and that can be obtained by the conventional method; however, the embodiment still enables four sensor substrates 3 to be obtained and retains the advantage of efficient utilization of the surface of the large-size insulating substrate 1.

In accordance with the embodiments described above, the large-size insulating substrate 1 is cut to a plurality of sensor substrates 3 that are shaped in forms other than a rectangle and two of which make a pair as they are arranged with one facing the other in various manners that make effective use of the surface of the large-size insulating substrate 1. This enables a greater number of sensor substrates 3 to be obtained by cutting the large-size insulating substrate 1 of standardized dimensions. Since the cost of forming semiconductors and other devices by a thin-film process on the large-size insulating substrate 1 of standardized dimensions is generally constant, the price per unit of sensor substrate 3 can be reduced by applying the process of the present invention.

In accordance with the process of the present invention, the input/output areas of device elements are provided at opposite ends of the original substrate, and two function areas are provided between opposite input/output areas, the original substrate is cut along lines in such a way that the input/output areas and the function areas are separated from one another. As a result, those portions of the original substrate where no function areas are to be formed are reduced, thereby contributing effective utilization of the surface of that substrate for increasing the number of sensor substrates that can be yielded from it. This eventually leads to a lower price per unit of sensor substrate.

What is claimed is:

1. A process for fabricating at least first and second electronic products from an intermediate product having a major surface, comprising the steps of:
   a first step of providing first and second function components both elongated parallel to an axis in the major surface of the intermediate product;
   a second step of providing a first input/output device for the first functional component and a second input/output device for the second functional component; and
   a third step of cutting the intermediate product into the two electronic products along a line that includes a first line portion in a direction intercepting the axis and lying between the first input/output device and the second functional component, a second line portion that proceeds generally parallel to the axis, and includes a third line portion in a direction intercepting the axis between the second input/output device and the first functional component, the second line portion separating the first and third line portions.

2. The process according to claim 1, further including:
   a fourth step of providing first and second switching access arrays respectively for said first and second functional elements and extending parallel to the axis in proximity to the first and second functional components;
   said first and fourth steps providing a first width orthogonal to the axis for the first functional component and the first switching access array in combination, and providing a second width orthogonal to the axis for the second functional component and the second switching access array in combination; and wherein;
   the second step comprises the step of providing the first input/output device for the first functional component and the first switching access array in combination and providing the second input/output device for the second functional component and the second switching access array in combination, said first and second input/output devices being separated at least by an elongation of the first or second functional component, the second step yielding for the first input/output device a first dimension orthogonal to the axis greater than the first width and less than the sum of the first and second widths and for the second input/ output device a second dimension orthogonal to the axis greater than the second width and less than the sum of the first and second widths.

3. The process according to claim 1, wherein the third step comprises cutting the intermediate product into the two electronic products along a line that includes as the first and third line portions, respective line portions that are orthogonal to the axis.

4. The process according to claim 1, wherein the third step comprises cutting the intermediate product into the two electronic products along a line that includes the first and third line portions as respective line portions that are curvilinear.

5. The process according to claim 1, wherein the third step comprises cutting the intermediate product into the two electronic products along a line that includes the first and third line portions as respective line portions that are oblique to the axis.

6. The process according to claim 1, wherein the third step comprises cutting the intermediate product into the two electronic products along a line that includes fourth and fifth line portions separate from the second line portion, separate from each other, and generally parallel to the axis.

7. The process according to claim 1, wherein the second step comprises providing first and second switching access arrays offset from the first and second functional elements respectively in opposite directions, the first and second dimensions of the first and second input/output devices having offsets from the first and second functional elements respectively even farther than the first and second switching access arrays in the same respective directions.

8. The process according to claim 1, wherein each functional component comprises a semiconductive sensor array.

9. A process for fabricating at least first and second electronic products from an intermediate product having a major surface, comprising the steps of:
   a first step of providing first and second functional components both elongated parallel to an axis in the major surface of the intermediate product;
   a second step of providing first and second switching access arrays respectively for said first and second functional elements and extending parallel to the axis in proximity to the first and second functional components;
   a third step of providing a first input/output device for the first functional component and the first switching access array in combination and a second input/output device for the second functional component and the second switching access array in combination, said first and second input/output devices each having first and second portions at opposite ends of the first and second functional components respectively, the third step yielding for the first and second portions of the first input/output device respective offsets in like directions orthogonal to the axis with respect to the first functional component and the first switching access array, and yielding for the first and second portions of the second input/output device respective offsets in like directions orthogonal to the axis with respect to the second functional component and the second switching access array; and
   a fourth step of cutting the intermediate product into two products along a line that includes a first line portion in a direction intercepting the axis and lying between the first portions of the respective first and second input/output devices, a second line portion that proceeds generally parallel to the axis, and a third line portion in a direction intercepting the axis and lying between the second portions of the respective first and second input/output devices, the second line portion separating the first and third line portions.

10. The process according to claim 9, wherein each functional component comprises a semiconductive sensor array.

11. A process for fabricating at least first and second electronic products from an intermediate product having a major surface, comprising the steps of:
   a first step of providing first and second functional components both elongated parallel to an axis in the major surface of the intermediate product;

a second step of providing first and second switching access arrays respectively for said first and second functional elements and extending parallel to the axis in proximity to the first and second functional components;

a third step of providing a first input/output device for the first functional component and the first switching access array in combination and a second input/output device for the second functional component and the second switching access array in combination, said first and second input/output devices each having first and second portions at opposite ends of the first and second functional components respectively, the third step yielding for the first and second portions of the first input/output device respective offsets in opposite directions orthogonal to the axis with respect to the first functional component and the first switching access array and yielding for the first and second portions of the second input/output device respective offsets in opposite directions orthogonal to the axis with respect to the second functional component and the second switching access array; and a fourth step of cutting the intermediate product into two products along a line that includes a first line portion in a direction intercepting the axis and lying between the first portions of the respective first and second input/output devices and includes at least another portion that proceeds generally parallel to the axis.

12. The process according to claim 11, wherein each functional component comprises a semiconductive sensor array.

* * * * *

UNITED STATES PATENT AND TRADEMARK OFFICE
CERTIFICATE OF CORRECTION

PATENT NO. : 5,337,474
DATED : August 16, 1994
INVENTOR(S) : Koichi OKA et al.

It is certified that error appears in the above-indentified patent and that said Letters Patent is hereby corrected as shown below:

Claim 1, Column 7, Line 5, change "function" to --functional--.

Claim 2, Column 7, Line 37, change "wherein;" to --wherein:--.

Signed and Sealed this

Twenty-eight Day of March, 1995

*Attest:*

BRUCE LEHMAN

*Attesting Officer*   *Commissioner of Patents and Trademarks*